United States Patent [19]

Mallory, Jr.

[11] 4,232,060
[45] Nov. 4, 1980

[54] METHOD OF PREPARING SUBSTRATE SURFACE FOR ELECTROLESS PLATING AND PRODUCTS PRODUCED THEREBY

[75] Inventor: Glenn O. Mallory, Jr., Los Angeles, Calif.

[73] Assignee: Richardson Chemical Company, Des Plaines, Ill.

[21] Appl. No.: 5,169

[22] Filed: Jan. 22, 1979

Related U.S. Application Data

[60] Continuation-in-part of Ser. No. 788,598, Apr. 18, 1977, abandoned, which is a division of Ser. No. 473,147, May 24, 1974, Pat. No. 4,019,910.

[51] Int. Cl.$^2$ .............................................. C23C 3/02
[52] U.S. Cl. ................................... 427/98; 106/1.11; 427/304; 427/305; 427/437; 427/438
[58] Field of Search .......... 106/1.11; 427/98, 304–306, 427/437, 438

[56] References Cited

U.S. PATENT DOCUMENTS

| 3,226,256 | 12/1965 | Schneble, Jr. et al. | 427/98 |
|---|---|---|---|
| 3,431,120 | 3/1969 | Weisenberger | 427/437 |
| 3,832,168 | 8/1974 | Gulla | 75/170 |
| 3,959,523 | 5/1976 | Grunwald et al. | 427/98 |
| 4,002,778 | 1/1977 | Bellis et al. | 427/98 |
| 4,019,910 | 4/1977 | Mallory | 427/437 |
| 4,020,197 | 4/1977 | Steffen | 427/304 |
| 4,122,215 | 10/1978 | Vratny | 427/304 |
| 4,136,216 | 1/1979 | Feldstein | 427/304 |

FOREIGN PATENT DOCUMENTS

1426462 2/1976 United Kingdom .

OTHER PUBLICATIONS

Pearlstein, "Electroless Plating", Modern Electroplating, John Wiley & Sons, pp. 710–729, c 1974.

Primary Examiner—John D. Smith
Attorney, Agent, or Firm—Lockwood, Dewey, Alex & Cummings

[57] ABSTRACT

Polyalloy catalytic coating formulations are used for preparing a metallic substrate surface to enhance subsequent plating thereover of nickel, cobalt or polyalloys including nickel or cobalt. At the same time, these catalytic formulations can be rinsed subsequent to their application onto the substrate and prior to the electroless deposition thereover. Improved products such as printed wiring boards may be made with these catalytic formulations. Such boards are prepared by depositing metal and forming circuitry patterns by using resists, etching techniques and the like which typically leave copper specks on the non-conductive board. The invention discourages electroless deposition by a nickel-containing plating bath over embedded copper specks, thereby reducing the possibility of developing bridging within the circuitry and in general undesirably increasing the conductivity of the board at locations other than on the circuitry pattern to produce printed wiring boards that are extremely resistant to developing short circuiting problems.

16 Claims, 1 Drawing Figure

U.S. Patent  Nov. 4, 1980  4,232,060
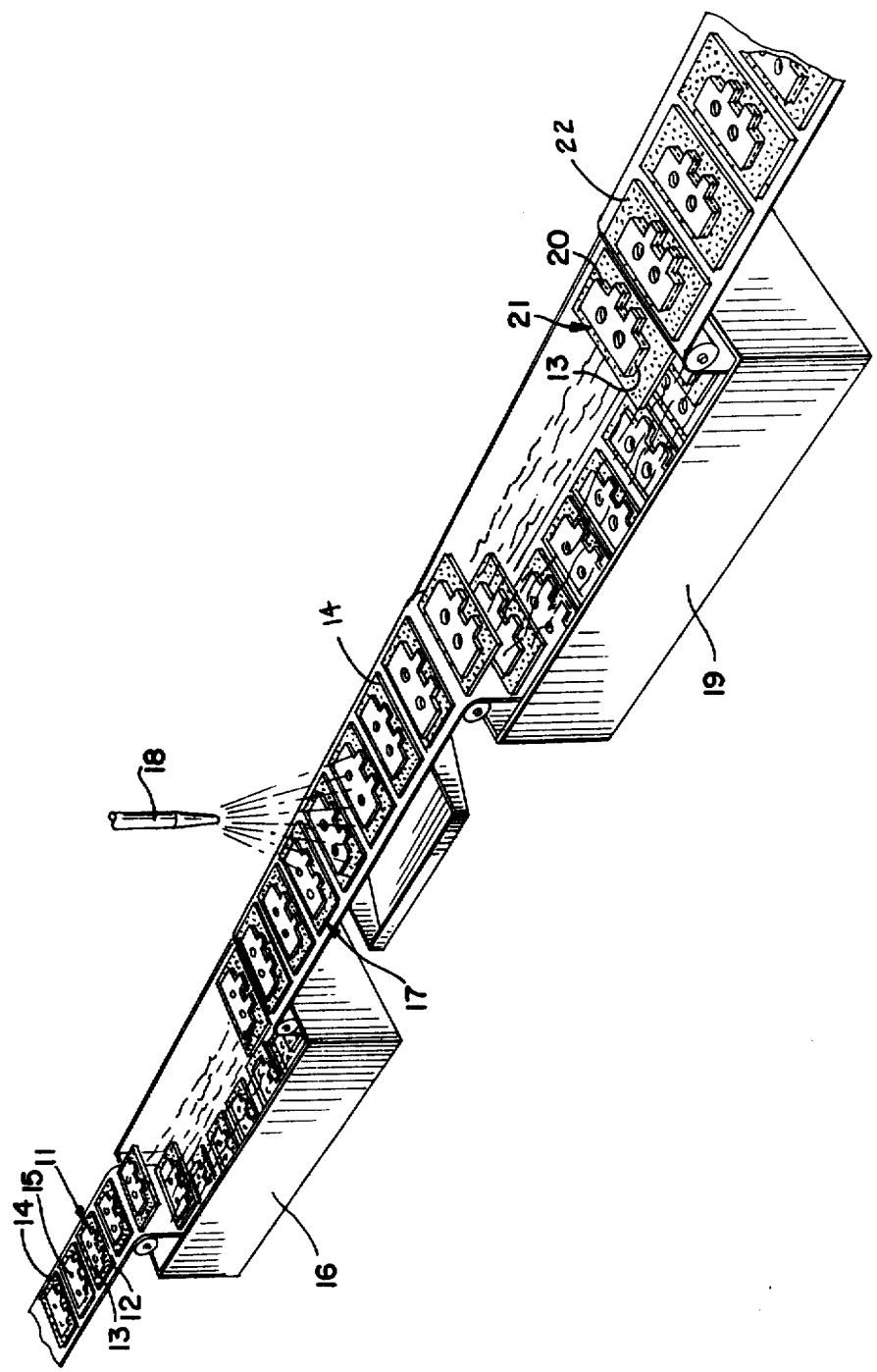

METHOD OF PREPARING SUBSTRATE SURFACE FOR ELECTROLESS PLATING AND PRODUCTS PRODUCED THEREBY

BACKGROUND AND DESCRIPTION OF THE INVENTION

This is a continuation-in-part of application Ser. No. 788,598, filed Apr. 18, 1977, which is a division of application Ser. No. 473,147, filed May 24, 1974, now U.S. Pat. No. 4,019,910. Application Ser. No. 788,598 is abandoned in favor of a co-pending continuation thereof, filed on Apr. 11, 1979, under application Ser. No. 029,523.

The present invention generally relates to the treatment of metal substrates so as to render them catalytic to subsequent electroless deposition of metals thereonto, and is especially well suited to the electroless deposition of nickel, cobalt, or polyalloys containing nickel and/or cobalt onto copper that had previously been plated onto a non-conductive substrate in an electronic circuitry pattern. In an important embodiment of this invention, printed wiring boards are prepared which are less likely to develop electrical short circuiting problems than plates prepared without the use of these catalytic solutions.

Copper-plated circuits tend to oxidize, making it highly desirable to overplate the copper with a more durable metal to thereby enhance the circuits' corrosion resistance, abrasion resistance, solderability and bondability to aluminum or gold wire by ultrasonic means or the like, while at the same time maintaining or enhancing adequate conductivity. Early procedures for providing overplatings included electroplating techniques which require electrically connecting each individual circuit of the printed wiring board to a current source. While electroless overplating does not require such inefficient handling techniques, and avoids other drawbacks of electroplating such as non-uniformity of coating at board locations relatively remote from the power source and exposed copper at the electrode connection sites, it has been found that such electroless overplatings do not readily adhere to copper or copper alloys.

When electrolessly overplating the copper circuitry of a printed wiring board or a printed circuit board with a nickel-phosphorus or nickel-boron deposit, general improvement has been found to be attained by dipping copper clad boards into a bath of an activator without rinsing in order to coat the copper clad board with a slightly alkaline film prior to nickel overplating in a slightly acidic electroless nickel bath. Activators known to be useful in this regard include a bath having dimethylamine borane to activate reduction of nickel onto the copper. A serious drawback of this procedure is that it activates the entire board including the insulating portions thereof to also activate the reduction of nickel onto portions of the board that are not in the circuitry pattern for carrying current, which leads to short circuiting or bridging, especially when the insulating portions have metal specks therein which serve as sites for plating initiation and bridging between specks and between specks and portions of the circuitry.

It is believed that one important reason for the undesirable plating in the non-circuitry portions is the fact that it is not possible to rinse the plate after treatment with such activators primarily because such a rinsing step would simply remove essentially all of the activator before it has had a chance to enhance the subsequent electroless step. Copper specks are often embedded into the surface of the board and they typically can not be seen by the human eye. Specks that reamin on the board at the time it is over-plated with nickel or the like serve as sites for electroless metal deposition at locations that are not within the circuitry pattern and which can eventually lead to short circuiting of the circuitry.

Another approach that has been taken in attempting to improve the electroless overplating of nickel or the like onto copper clad boards includes the use of baths having materials, known generally as catalyzing agents, which operate to make the copper surface more receptive to the electroless deposition of metals thereover. A know catalyzing agent is a palladium chloride dip which, although it effectively catalyzes the copper, has been found that adhesion between the copper and the subsequently electrolessly deposited metal is tenuous; and, as a result, when circuits made in this manner are subjected to rugged mechanical handling, or heat shock such as that developed during dip soldering, there is a tendency for the conductive layer to crack or pop free of the non-conductive base, thereby disrupting the circuit. Discussions relative to catalyzig agents are found in Schneble et al U.S. Pat. No. 3,226,256 and Weisenberger U.S. Pat. No. 3,431,120.

It has now been discovered that certain formulations perform quite effectively as catalyzing agents in order to enhance the adhesion of nickel, cobalt, or polyalloys of nickel and/or cobalt over copper surfaces, especially those copper surfaces found on printed wiring boards for use in preparing printed circuitry, while at the same time permitting a procedure whereby these catalyzing agents in conjunction with a rinse will enhance overdeposition only upon the metal carrying components of the circuit board to the exclusion of other metal imbedded in the board.

These results are achieved in accordance with the present invention basically by employing catalyzing formulations that include nickel or cobalt and a source of a secondary, inhibitor-type of metal such as tin, molybdenum, copper or tungsten, together with a reducing agent. Such catalyzing formulations can be applied to a copper surface and rinsed to form a catalytic film for enhancing electroless overplating in a bath that deposits nickel or cobalt, either alone or in combination with other metals, onto the circuitry pattern but discourages overplating onto portions of the board not within the circuitry pattern.

Accordingly, an object of this invention is to provide a formulation and a method for improving electroless plating and products produced in accordance therewith.

Another object of the present invention is to provide a formulation, method, and product having improved adhesion of an electrolessly deposited metal over copper, copper alloys, or the like.

Another object of this invention is to provide an improved catalyzing agent, its method of use, and products produced therewith.

Another object of the present invention is to provide an improved catalyzig agent, method, and product which exhibit enhanced adhesion and simultaneously allow for rinsing just prior to electroless overplating for reducing the tendency to bridge or short circuit.

Another object of the present invention is an improved method for providing a catalytic surface onto plated copper, which surface can be subsequently treated by electroless deposition of nickel, cobalt, and/or polyalloys including either.

Another object of this invention is to provide an improved catalyzing agent which includes nickel or cobalt and tin, molybdenum, copper or tungsten together with a reducing agent, which catalyzing agent is suitable for incorporation into a bath.

These and other objects of the present invention will be apparent from the following detailed description, taken in conjunction with the accompanying drawing wherein:

The FIGURE is a generally schematic view depicting a production flow in accordance with this invention and products at various stages of production.

Catalyzing agents in accordance with this invention are, in general, polymetallic formulations of deposition-enhancing nickel and/or cobalt metal, and of secondary or inhibitor-type metals such as tin, molybdenum, copper and tungsten. As such, these catalyzing agents are related to the electroless polyalloy plating formulations shown in Mallory U.S. Pat. No. 4,019,910, hereby incorporated by reference hereinto. Typically, the formulations will be put to use within an aqueous bath which also includes a reducing agent for electroless baths.

Any of these metals can be added as soluble salts, salts of low solubility within the particular electroless bath system in which they are intended to be used, esters, or substantially any other source suitable for electroless systems. In an important aspect of this invention, boron is added to the system as a third metal by means of a boron-containing reducing agent.

Suitable salts of nickel or cobalt include sulfates, chlorides, sulfamates or other anions compatable with these electroless systems. These same anions usually provide an acceptable source of salts of the secondary metals, including for example stannous chloride, stannous fluoroborate, sodium stannate, cuprous chloride, cuprous sulfate, and cupric salts, although it is preferred that these secondary metals be provided in the form of ester complexes of polyhydric compounds which are prepared by conventional techniques involving reation between an oxyacid and a polyhydric acid or alcohol. The oxyacids are generally inorganic acids of the particular metal cation, for example, the tungstic, molybdic or boric acids. Representative of the polyhydric acids or alcohols which may be employed are carboxylic acids or alcohols which contin at least two hydroxy groups and from about four to about fifteen carbon atoms per molecule. Typical polyhydric compounds include acids such as tartaric, gluconic, or glucoheptonic acid, or alcohols such as mannitol, 2,3-butanediol or 1,2,3-propanetriol. Of these various polyhydric compounds, the carboxylic acids are generally preferred, and a particularly suitable one is glucoheptonic acid. The ester complexes may also be, and in certain instances preferably are, in the form of a polyester, that is as ester complex formed by reacting two or more mols of the oxyacid with one mol of the polyhydric compound.

Ester complexes of these general types are formed and are generally believed to exist in aqueous solution as a complex equilibrium mixture where the cation of the oxyacid forms one or more ester linkages either with two hydroxyl groups of the polyhydric compound or with one hydroxyl group and one carboxylic acid group when the polyhydric compound is an acid, for example glucoheptonic acid. Such an ester complex has been found to be quite stable when used within baths prepared with the catalyzing formulations.

Catalyzing baths for use in connection with the catalyzing agent formulations of this invention will usually include a reducing agent for the cations in the bath. While reducing agents such as hydrazine may be used, it has been found to be most advantageous if the reducing agent is a boron compound whereby boron cations are provided to the system and assist in forming the catalyzing film, together with the nickel or cobalt and the secondary metal. Various boron-containing compounds can be used; they are preferably any of those employed as reducing agents in electroless nickel or cobalt plating baths. Typical examples include boron hydrides, amine boranes or lower alkyl substituted amine boranes such as dimethyl-or diethyl-amine borane. Generally, of the various boron compounds which may be employed, the alkylamine boranes are preferred, particularly dimethylamine borane.

In general, when these various agents are combined with water and formulated into a catalyzing bath, the total bath will usually be alkaline although slightly acidic baths can be put to practice, a typical pH range being between 5.5 and 13, preferably between about 8 and about 11. Operating temperatures are between room temperature and the boiling temperature of the bath, a typical temperature range being between about 20° and 100° C. These baths are, in general, capable of operating as electroless polyalloy plating baths; their catalyzing function is achieved in part by using relatively low concentrations of active ingredients and by limiting the time period during which the article being subjected to the catalyzing agent remains within the bath. Very generally, active ingredient concentrations about one-tenth those of plating baths can be formulated. The time period is such that the catalytic agent will form a coating to the extent that the surface is "nucleated", typically with a tertiary polyalloy, in order to provide a film that is not necessarily observable to the unaided eye but which will perform as catalyzing agent even after rinsing a substrate that had been immersed in the bath. Generally, catalyzing bath immersion will continue for between about 10 to 90 seconds, usually no more than 60 seconds, at approximately 0.1 mil/hour, the most appropriate time and rate depending upon the particular catalyzing system being used, the temperature of the bath, the pH of the bath, and the precise make-up of the material being overplated.

Plating baths prepared with formulations according to this invention may, if desired, contain conventional bath additives which are commonly employed in electroless plating baths. Included are bath stabilizers such as sulfur containing compounds, for example thiourea, as well as pH regulators such as an acid or a base, complexing agents for the metal ions maintained within the bath, such as ethylene diamine tetracetic acid, potassium pyrophosphate or polyamines, or sulfide ion controllers such as lead. Buffering agents can also be added to improve the pH stability of the bath.

In proceeding with the method according to this invention, a metal substrate that is not normally receptive to electroless nickel or cobalt plating baths is rendered catalytic whereby nickel or cobalt can be electrolessly deposited thereover. Not only does the method include catalyzing a surface and improving adhesion between the nickel or cobalt and the overcoated metal, but also it allows for rinsing after the application of the catalytic coating in order to enhance the quality of products produced thereby.

As an aid for illustrating this invention, reference is made to the FIGURE, which generally depicts the catalyzing and overplating of a copper clad board, generally designated 11, that had been prepared by conventional plating techniques to plate about ¼ ounce of copper per square foot of plating area. These conventional plating techniques prepare a copper clad board by a process which includes removing copper from a plate 12 at those locations that are not within a circuitry pattern 13, which, in general tends to leave copper specks or particles 14 lying on the surface of plate 12 and often embedded into that surface.

Typical conventional techniques (not depicted) can include adhering copper to the plate, for example an expoxy fiberglass plate, at which stage procedures such as drilling holes 15 can be proceeded with, and this can be followed by laying down a resist and plating copper onto the board. The copper plating can be entirely electroless, but the length of time needed to plate a suitable thickness is shortened if an electroless copper deposition is followed by an electrodeposition of copper. Then, by etching, lifting-off, or the like, the copper that had been plated onto the non-circuitry portions of the plate 12 is removed in order to leave an isolated circuitry pattern to form the copper clad board 11.

Conventional further treatment that is not depicted can include cleaning the copper clad board in a mildly alkaline detergent bath for on the order of about five minutes at an elevated temperature that will not damage surfactants in the bath. After rinsing with water to remove residual carry-over, the plates are often either mechanically scrubbed or are dipped in an etching agent such as ammonium persulfate at a concentration of about 1 pound per gallon in order to etch off surface oxides and render the copper more active for subsequent deposition, which step would typically be followed by rinsing with tap water or the like. Next, a copper clad plate would usually be acid dipped as insurance that any residual surface materials are removed and in order to reactivate the copper. A mineral acid bath, such as 10% sulfuric acid, or a dry acid salt such as sodium bisulfate salts can be used, following by rinsing for about one minute with, for example, deionized water. Even if every one of these further treatments are conducted on the copper clad board 11, the residual specks or particles of copper remain on the plate portion 12 off of the circuitry pattern 13.

Copper clad board 11 is treated with the catalyzing agent in accordance with this invention, with the general objective of forming a catalyzing film thereon to, generally speaking, nucleate the copper surface with what may be in the nature of a monomolecular layer. Typically, this treating step will include immersing the board 11 into a bath 16 having the catalyzing agent according to this invention. This treating step should not be of such a length that electroless plating actually occurs, but should be of a duration adequate to provide a catalytic coating of the board as shown at 17. When the bath immersion technique is used, a typical suitable time period will be between about 10 and 60 seconds, the exact time that is most suitable depending upon the particular catalyzing systems being used, the temperature of the bath, the pH of the bath, the reducing agent used, and the makeup of the copper clad board.

The catalyzing treatment time is also dependent somewhat upon the temperature of the bath in which the catalyzing agent is used, with typical temperature ranges being between about 20° C. to substantially boiling, or about 100° C., preferred temperatures ranges therewithin varying somewhat depending upon the particular reducing agent included within the bath.

After treatment with the catalyzing agent, the board 17 is subjected to a rinsing step, illustrated in the Figure by spray nozzle 18, although any means or method for rinsing may be used, such as running through a water bath for a very short period of time. This rinsing step will not significantly affect the catalytic surface formed by the catalyzing agent at the circuitry pattern 13 or the particles or specks of metal 14, but the rinsing step does wash away all of the plating solution, especially that on the insulator board 12, which is not nucleated or catalyzed, only the metal portions having been nucleated. It is possible to then pass the rinsed board 17 into subsequent baths, even those having hypophosphite, which is not possible when activator solutions such as dimethylamine borane are used instead of catalyzing agents of this invention.

It has been found that the catalyzing agents, when used according to the method of this invention, can be combined with this subsequent rinsing step in order to obtain a result that catalyzes plating on the circuitry pattern by nucleating, or providing active sites thereon, while at the same time avoiding enhancement of deposition, typically discouraging deposition, at those locations on the surface of the board 12 that are not within a circuitry pattern 13. As a result, after the catalyzing agent films are electrolessly plated over with nickel, cobalt, or polyalloys including either or both, the electroless overplating is selectively deposited onto only the nucleated metal and does not spread onto the insulator board by way of forming plated bridges between specks and/or the circuitry pattern, which undesirable spreading out or extending is otherwise started at and encouraged by the specks within a catalyzed board environment provided by other systems. In this way, a finished printed circuit or wiring board can be made with precisely overplated circuitry pattern, one that does not have substantial excess deposits outside of the pattern which can and often do lead to short circuiting within the circuitry pattern and a generally undesirable increase in the conductivity of the board 12 outside of the pattern.

Rinsing solutions suitable for use in the rinsing step will typically be aqueous, and the rinsing step itself should be long enough to significantly reduce the effect of catalyzing agent that had been placed onto the non-circuit portion during the immersion step. The maximum rinsing time desired will be determined by convenience and economics in general, there being a point at which lengthy rinsing times will become expensive. On the whole, lengthy rinsing will not reduce the extent that the surfaces are catalyzed since it is the surfaces themselves that are transformed rather than a rinsable film being placed thereon. The catalytic surface will be removed only by etching off or otherwise removing the copper or the like from the board. Multiple rinsing can be carried out, and the rinsing can be in a still bath, under a running bath, or the like. Rinsing times will vary somewhat depending upon the overall make-up of the plates, the materials, other physical conditions, and whether the rinsing solution is running or still, typical times generally ranging between about 2 seconds and about 45 seconds for each rinse. The preferred rinsing times will depend upon the catalyzing agent being used, the extent to which the catalyzing agent has adhered to the copper prior to rinsing, and the solventizing ability of the particular rinsing agent being used. Usually, a cool water rinsing agent, such as tap water or deionized water at ambient temperature, is preferred primarily because of the ready availability and low cost of water. If desired, wetting agents could be added, provided they do not interfere with the subsequent electroless plating.

Once rinsing in accordance with this invention has been accomplished, the selective electroless plating step is ready to be carried out. Catalytic flims formed in accordance with the preceeding steps are especially receptive to electroless deposition of nickel plating or cobalt plating within any number of baths, such as nickel-phosphorous baths, electroless cobalt plating baths, or pollyalloy type baths, including ones listed in U.S. Pat. No. 4,019,910. The rinsed board 17 is electrolessly plated in a conventional manner, such as within a plating bath 19, whereby an overcoated layer 20 is added to the copper circuitry pattern 13 in order to form an overcoated circuit board 21, shown in the FIGURE emerging from the bath 19, which has substantially no overplating deposits that are not within the precise circuitry pattern 13, except for any specks 22 that had been catalyzed and overplated but not spread out or expanded into a bridging or short circuiting path, the specks 14 and 22 being illustrated in exaggerated size for drawing clarity.

Included within the electroless plating bath 19 can be a source of nickel cations or cobalt cations, a source of other metal cations when polyalloy deposition is to be accomplished, a pH regulator, a reducing agent, a complexing agent, water, bath stabilizers, sulfide ion controllers, or other suitable bath ingredients. Details concerning many of these various ingredients and the conditions suitable for such baths are discussed in U.S. Pat. No. 4,019,910. Also, a typical nickel-phosphorous electroless plating bath usually would form a binary coating having between about 88 to 95 percent nickel and between about 12 to 5 weight percent phosphorus.

If desired, especially when preparing printed circuit boards of high quality, it is possible, usually after one or more rinsing steps, to plate over the overcoating of nickel, cobalt, or polyalloy with another metal, such as gold, in order to enhance the solderability and corrosion resistance of the circuit. When final plating is completed, the substrate formed by this invention, such as a printed circuit or wiring board, will be allowed to dry or will be dried according to any desired drying procedure.

While there is no desire to be bound by any theory concerning the operation of this invention, it is believed that the inclusion of metals generally accepted as being inhibitors, especially in the case of the molybdenum, tungsten or tin secondary metals, cooperate with the plating enhancement abilities of the nickel or cobalt within the catalyzing agent to render catalytic the otherwise non-catalytic surfaces, especially copper circuitry patterns. The combination of the nickel or cobalt with the inhibitor-type secondary metals is believed to bring about the catalyzing properties attained by this invention by nucleating the otherwise non-catalytic surface and thus render the surface itself catalytic rather than merely lay a film over such surface that will be washed off during a subsequent rinsing step. It is believed that this particular combination within the system of this invention enhances the deposition efficiency of the system to the extent that a catalyzing surface is actually formed from a surface that previously was non-catalytic. Once such a catalytic surface is formed, it is possible to electrolessly plate thereover because the overplating reaction is thereby encouraged, the catalyzed surface being much more favorable to deposition thereover than the original non-catalytic surface, especially when such overdeposition is that of a polyalloy. The components of the system cooperate with each other to efficiently utilize the attributes of each to the extent that the system will successfully transform a non-catalytic surface into a catalyzed one.

As far as the mechanism by which the catalyzing agent itself renders the circuitry pattern more receptive to overplating, it is believed that galvanic initiation plays a part in instituting the overplating surface. In a general sense, the catalyzing agent transforms the copper surface to the extent it is rendered catalytic for the subsequent overplating step. The ultimate result is a preferential catalyzing of the copper within the circuitry pattern.

It is believed that the results attributable to the invention are enhanced by including boron within the sensitizing agent formulation, which inclusion can be most readily accomplished by using a boron-containing reducing agent. It is also possible that physical attributes of the various materials involved in the process contribute to this effect. An immersion within the catalyzing agent bath wets all of the board, but the surface textures of the board within and out of the circuitry pattern are different, which would indicate that the effects of the subsequent rinsing step on the make-up of the catalyzing agent left on the board will be different too.

Baths incorporating the catalyzing agents according to this invention are typically alkaline. It is believed that operating with pH any lower than about 5.5 can lead to bridging or plating in between portions of the circuitry pattern, and a pH that is too high, say above about 13, would be unnecessarily severe. The preferred pH range is between about 8 and 11. The concentration of the deposition-enhancing metals such as nickel compounds within a bath according to the invention can be between about 0.001 and about 0.3 mol/liter, usually between about 0.002 to about 0.125 mol/liter. A typical range for the secondary metals such as the tin compounds within such baths is between about 0.001 to about 0.5 mol/liter, generally between about 0.002 and about 0.250 mol/liter. Reducing agent concentrations such as those for dimethylamine borane can be between about 0.001 and about 0.2 mol/liter, usually between about 0.002 and 0.1 mol/liter. The upper limits of the various constituents are determined by economics and solubility, and the lower limits by minimal effectiveness.

While the Figure and this specification deal primarily with the preparation of printed circuit boards, the invention is suitable for use whenever it is desired to catalyze a metal surface, particularly a copper surface, for subsequent overplating with nickel, cobalt, or polyalloys including same. Eventual end uses for products produced according to this invention include boards for carrying electrical circuit components within games, watches, or magnetic memory devices in computer-type applications. These may be in the form of 2-sided printed etched boards which can have plating through holes therein. The following examples are offered to illustrate the present invention:

EXAMPLE 1

Nickel-Molybdenum-Boron

A catalyzing agent immersion bath was prepared to include 0.01 mol/liter molybdenum ester of gluconic acid, 0.05 mol/liter nickel sulfate, 0.1 mol/liter potassium pyrophosphate, which is a buffer and complexing agent, and 0.004 mol/liter dimethylamine borane reducing agent. The operating pH was 9.0, and the operating temperature was 40° C. This bath formed an adherent catalytic film on copper alloys that was then overplated with electroless nickel. Printed circuit boards were prepared and exhibited an enhanced adhesion between the copper and its nickel-containing overcoating. The use of printed circuits thus prepared were found to be more consistently less susceptible to developing short circuits during use.

EXAMPLE 2

Nickel-Tungsten-Boron

Another catalyzing bath was prepared and used generally in accordance with Example 1, this catalyzing agent bath including 0.005 mol/liter tungsten ester of glucoheptonic acid, 0.02 mol/liter nickel sulfate, 0.05 mol/liter potasium pyrophosphate, 0.04 mol/liter dimethylamine borane, with the balance of the bath being essentially water. The bath was operated at a pH of 9.0, and the operating temperature was 40° C.

EXAMPLE 3

Nickel-Tungsten-Boron

Another bath that had been prepared and is suitable for use as a catalyzing agent bath includes 0.2 mol/liter of a tungsten ester of glucoheptonic acid, 0.1 mol/liter of nickel sulfate, 0.06 mol/liter of dimethylamine borane and 1 ppm of thiourea. The operating conditions were a pH of 9.6 and a temperature of 90° C., and the catalytic film prepared thereby should include 77.4 weight percent nickel, 20.0 weight percent tungsten, and 2.6 weight percent boron.

EXAMPLE 4

Nickel-Tungsten-Tin-Boron

Another suitable catalytic agent bath includes deionized, carbon treated and filtered water containing 0.2 mol/liter tungsten ester of glucoheptonic acid, 0.1 mol/liter nickel sulfate, 0.025 mol/liter stannous chloride, 0.06 mol/liter dimethylamine borane, and 1 ppm of thiourea, the operating temperature being 90° C. and the pH being about 7.5. This bath produces a catalytic film believed to be analyzable as 77.9 weight percent nickel, 16.0 weight percent tungsten, 4.2 weight percent tin, and 1.9 weight percent boron.

EXAMPLE 5

Nickel-Tin-Boron

A suitable catalytic plating aqueous bath includes 0.1 mol/liter of nickel sulfate, 0.1 mol/liter of stannous chloride, 0.06 mol/liter of dimethylamine borane, 0.2 mol/liter of potassium pyrophosphate, 1 ppm of thiourea, and 0.1 mol/liter of a diboron ester of glucoheptonic acid, which was prepared by charging approximately 2 mols of boric acid and 1 mol of sodium glucoheptonate into an esterification vessel containing about 600 milliliters of water as a solvent, followed by stirring while maintaining the temperature at about 25° C. for 30 minutes, after which it was diluted to a final volume of 1 liter with additional water. This bath produces a catalytic film which has been analyzed in thicker, plating, operations as 92.8 weight percent nickel, 6.1 weight percent tin, and 1.1 weight percent boron.

EXAMPLE 6

Nickel-Molybdenum-Boron

An aqueous catalyzing agent bath was produced to include 0.001 mol/liter of a molybdenum ester of glucoheptonic acid, 0.1 mol/liter of nickel sulfate, 0.06 mol/liter of dimethylamine borane, and 0.3 mol/liter of lactic acid, the operating pH being 10.0, and the operating temperature being 90° C. This bath produces a catalytic film which has been analyzed in thicker, plating, operations as 79.8 weight percent nickel, 20 weight percent molybdenum, and 0.2 weight percent boron.

EXAMPLE 7

Nickel-Molybdenum-Copper-Boron

A catalyzing agent bath was prepared by adding the following to deionizied, carbon treated and filtered water: 0.001 mol/liter of molybdenum ester of glucoheptonic acid, 0.1 mol/liter of nickel sulfate, 0.0005 mol/liter of copper sulfate, 0.06 mol/liter of dimethylamine borane, and 0.3 mol/liter of lactic acid. The operating temperature was 90° C. and the operating pH was 10. This bath has been analyzed to produce a coating of 77.87 weight percent nickel, 20 weigh percent molybdenum, 1.8 weight percent copper, and 0.33 weight percent boron.

EXAMPLE 8

Nickel-Tin-Boron

A tin-containing catalyzing bath is prepared by adding to water 0.001 mol/liter of nickel ion, 0.02 mol/liter of sodium stannate (tetravalent) complex of gluconic acid, and 0.02 mol/liter of dimethylamine borane. A very similar bath is prepared when 0.002 mol/liter of dimethylamine borane is included therein.

EXAMPLE 9

Nickel-Tin-Boron

Another useful catalyzing agent bath includes 0.001 mol/liter of the stannate ester of glucoheptonic acid, 0.1 mol/liter of nickel sulfate, 0.06 mol/liter of dimethylamine borane, and 0.3 mol/liter of lactic acid, with the operating temperature being 90° C. and the operating pH being 10.0.

EXAMPLE 10

Cobalt-Tungsten-Boron

A complexing agent aqueous bath for subsequent cobalt overcoating has 0.2 mol/liter of the tungsten ester of glucoheptonic acid, 0.1 mol/liter of cobalt sulfate, 0.06 mol/liter of dimethylamine borane, and 1 ppm of thiourea. The operating pH is about 9.6 at a temperature of about 90° C., coating analysis being about 81 weight percent cobalt, 18 weight percent tungsten and 1 weight percent boron. After application of a catalyzing film with this bath, subsequent cobalt overplating can be accomplished by using a similar bath.

EXAMPLE 11

Cobalt-Molybdenum-Phosphorus

Copper catalyzing bath can be prepared including 0.1 mol/liter of molybdenum ester of gluconic acid, 0.1 mol/liter of cobalt sulfate, and 0.28 mol/liter of sodium hypophosphite. An operating pH is 10.0, and an operating temperature is 90° C., the film to be prepared having about 92.9 weight percent cobalt, 1.1 weight percent molybdenum, and 6 weight percent phosphorus. If desired, the bath formulation is useful for coating over this catalytic coating after rinsing with cold water, typically including increasing the plating rate to about 0.2 to 0.3 mil/hour and reducing the pH to an acidic level.

EXAMPLE 12

Cobalt-Tin-Boron

An aqueous catalyzing agent bath can be prepared to include 0.1 mol/liter of cobalt sulfate, 0.2 mol/liter of a sodium stannate complex of gluconic acid, and 0.4 mol/liter of dimethylamine borane. The operating temperature is 60° C. at a pH of about 7.

EXAMPLE 13

After any of one of the catalyzing agent baths of Examples 1 through 9 have been used to prepare a catalytic film on a copper substrate which remained in the bath for about 45 seconds, and after that film has been rinsed with water twice for 15 second time periods, nickel can be electrolessly plated thereover using an aqueous bath having 0.1 mol/liter of nickel sulfate, 0.2 mol/liter of citric acid and 0.17 mol/liter of sodium hypophosphite. The operating pH is between about 4.5 and 5.0 at a temperature of 90° C., and the plating rate is about 10 microns/minute which usually continues for about 10 to 20 minutes. The overplating is generally complete, no bridging or coating over of copper specks on the board being observable.

EXAMPLE 14

After copper clad substrates are immersed in any of one of the catalyzing agent baths of Examples 1 through 9 for about 45 seconds to prepare a catalytic film thereon, and after that film has been rinsed twice with running water, a nickel overplating can be electrolessly formed thereover at about 40° C. and a pH of 5.0 using an aqueous bath having 0.1 mol/liter of nickel sulfate, 0.25 mol/liter of succinic acid, and 0.04 mol/liter of dimethylamine borane. This was followed by two running water rinses and further overplating with an electroless gold bath at 63° C. and at a plating rate of about 1 micron/minute.

While in the foregoing specification certain embodiments and examples of this invention have been described in detail, it will be appreciated that modifications and variations therefrom will be apparent to those skilled in this art. Accordingly, this invention is to be limited only by the scope of the appended claims.

I claim:

1. A method for preparing a printed wiring board which comprises treating a wiring board having a circuitry pattern thereon with a polymetallic catalyzing agent bath including a deposition-enhancing metal selected from the group consisting of nickel, cobalt, and combinations thereof, and a secondary metal selected from the group consisting of tin, molybdenum, copper, tungsten, and combinations thereof, said catalyzing agent bath including copper only when it also includes one or more of tin, molybdenum or tungsten as said secondary metal, said bath including an ester complex of a polyhydric compound, said catalyzing agent bath enhancing subsequent overplating onto said circuitry pattern, said treating step lasting for a time period sufficient to nucleate the surface of the circuitry pattern and insufficient to deposit a generally continuous plating film thereon, said treating step being followed by rinsing said catalyzing agent bath treated circuit board with an aqueous rinsing agent, said treating step and said rinsing step cooperating to enhance catalyzing agent film formation onto said circuitry pattern in preference to portions of the wiring board that are not within the circuitry pattern to provide a preferentially catalyzed wiring board; and thereafter immersing the preferentially catalyzed wiring board into a bath for overplating the circuitry pattern with a metal selected from the group consisting of nickel, cobalt, and polyalloys including nickel or cobalt.

2. The method of claim 1, wherein said rinsing step is not more than about 60 seconds in length.

3. The method of claim 1, wherein said treating step includes immersing the wiring board into a bath including said catalyzing agent together with a reducing agent for cations of said metals included in said catalyzing agent.

4. The method of claim 1, wherein said treating step includes immersing the wiring board into a bath including said catalyzing agent together with a boron-containing reducing agent.

5. The method of claim 1, wherein said treating step includes immersing the wiring board into an alkaline aqueous bath.

6. The method of claim 1, wherein said treating step includes immersing the wiring board into an aqueous bath having a pH between about 5.5 and about 13.

7. The method of claim 1, wherein said treating step includes immersing the wiring board into an aqueous bath at a temperature between about 20° and about 100° C.

8. The method of claim 1, wherein said treating step includes immersing the wiring board into an aqueous bath.

9. The method of claim 1, wherein said treating step includes immersing the wiring board into an aqueous bath for a time period between about 10 and about 90 seconds.

10. The method of claim 1, wherein said polymetallic catalyzing agent is included in a formulation of a metal selected from the group consisting of nickel and cobalt, another metal selected from the group consisting of molybdenum, tungsten, tin and copper, and an element selected from the group consisting of boron and phosphorus.

11. The method of claim 1, wherein said wiring board includes a generally non-conductive plate onto which the circuitry pattern is secured, said circuitry pattern containing copper.

12. The method of claim 1, wherein said treating step includes immersing the wiring board into an aqueous bath having between about 0.001 and about 0.3 mol/liter of the deposition-enhancing metals, between about 0.001 and about 0.5 mol/liter of the secondary metals, and between about 0.001 and about 0.2 mol/liter of a reducing agent, all as based on the total volume of the bath.

13. A method for catalyzing a non-catalytic metal surface comprising treating the non-catalytic metal surface with a polymetallic catalyzing agent bath including a deposition-enhancing metal selected from the group consisting of nickel, cobalt and combinations thereof, and a secondary metal selected from the group consisting of tin, molybdenum, copper, tungsten and combinations thereof, said catalyzing agent bath including copper only when it also includes one or more of tin, molybdenum or tungsten as said secondary metal, said bath including an ester complex of a polyhydric compound, said treating being under slightly acidic to generally alkaline conditions and being for a period of time sufficient to nucleate said non-catalytic metal surface and insufficient to deposit a generally continuous plating film thereonto, said treating step being followed by rinsing said nucleated metal surface with an aqueous rinsing agent for enhancing preferential catalyzing agent film formation onto said nucleated metal surface.

14. The method of claim 13, wherein said treating step includes immersing the non-catalytic metal surface into a bath including said catalyzing agent together with a reducing agent for cations of said metals included in the catalyzing agent.

15. The method of claim 13, wherein said treating step includes immersing the non-catalytic metal surface into an aqueous bath having a pH between about 5.5 and about 13, the bath being at a temperature between about 20° and about 100° C., for a time period sufficient to nucleate the non-catalytic metal surface and insufficient to deposit a generally continuous plating film thereon.

16. The method of claim 13, wherein said non-catalytic metal surface is a copper-containing surface.

* * * * *